United States Patent [19]
Ikeda

[11] Patent Number: 6,087,716
[45] Date of Patent: Jul. 11, 2000

[54] SEMICONDUCTOR DEVICE PACKAGE HAVING A CONNECTION SUBSTRATE WITH TURNED BACK LEADS AND METHOD THEREOF

[75] Inventor: Hironobu Ikeda, Tokyo, Japan

[73] Assignee: NEC Corporation, Tokyo, Japan

[21] Appl. No.: 09/015,079

[22] Filed: Jan. 29, 1998

[30] Foreign Application Priority Data

Feb. 3, 1997 [JP] Japan ................................. 9-020575

[51] Int. Cl.[7] .............................................. H01L 23/495
[52] U.S. Cl. ...................... 257/676; 257/692; 257/693; 257/696
[58] Field of Search ................... 257/676, 696, 257/778, 672, 692, 693

[56] References Cited

U.S. PATENT DOCUMENTS

| | | | |
|---|---|---|---|
| 4,677,458 | 6/1987 | Morris | 257/696 |
| 5,177,326 | 1/1993 | Goldhammer | 257/693 |
| 5,317,479 | 5/1994 | Pai et al. | 257/692 |
| 5,347,159 | 9/1994 | Khandros et al. | 257/692 |
| 5,536,909 | 7/1996 | DiStefano | 174/261 |
| 5,568,363 | 10/1996 | Kitahara | 257/676 |
| 5,731,631 | 3/1998 | Yama et al. | 257/778 |
| 5,789,804 | 8/1998 | Matsuoka et al. | 257/696 |
| 5,789,809 | 8/1998 | Joshi | 257/778 |

FOREIGN PATENT DOCUMENTS

| | | | |
|---|---|---|---|
| 5-166874 | 7/1993 | Japan | 257/676 |
| 5-326643 | 12/1993 | Japan | 257/676 |
| 6-181234 | 6/1994 | Japan | 257/676 |
| 6-295935 | 10/1994 | Japan . | |
| 7-201912 | 8/1995 | Japan . | |
| 7-509352 | 10/1995 | Japan | 257/676 |
| 9-22956 | 1/1997 | Japan . | |

*Primary Examiner*—Donald L. Monin, Jr.
*Assistant Examiner*—Mike Dietrich
*Attorney, Agent, or Firm*—Foley & Lardner

[57] ABSTRACT

A semiconductor device mount structure containing a semiconductor device (10), a connection substrate (30) disposed at the lower side of the semiconductor device (10), and leads (20) which are connected to external connection terminals (12) of the semiconductor device (10) at one ends thereof, turned back and connected to wires provided on the connection substrate (30) at the other ends thereof. The connection substrate (30) is constructed by plural carrier substrates. Each of the plural carrier substrates is right-angled isosceles triangular, and the plural carrier substrates are arranged so as to form a substantially square shape at the lower portion of the semiconductor device (10).

11 Claims, 6 Drawing Sheets

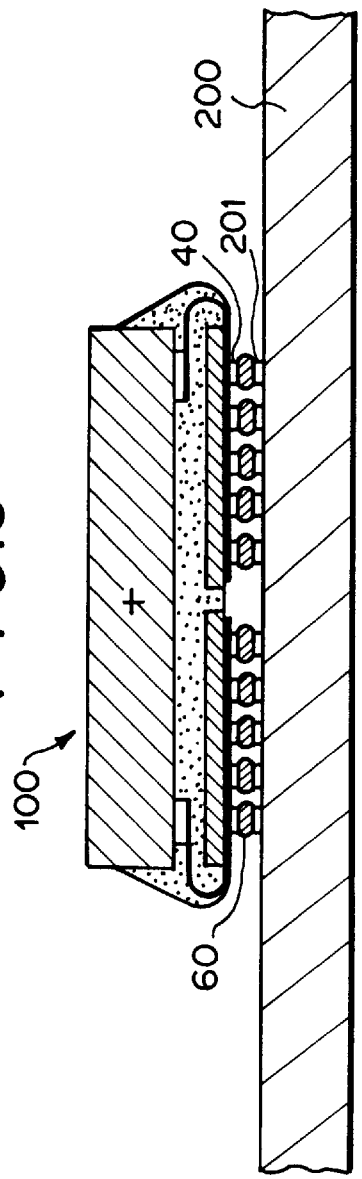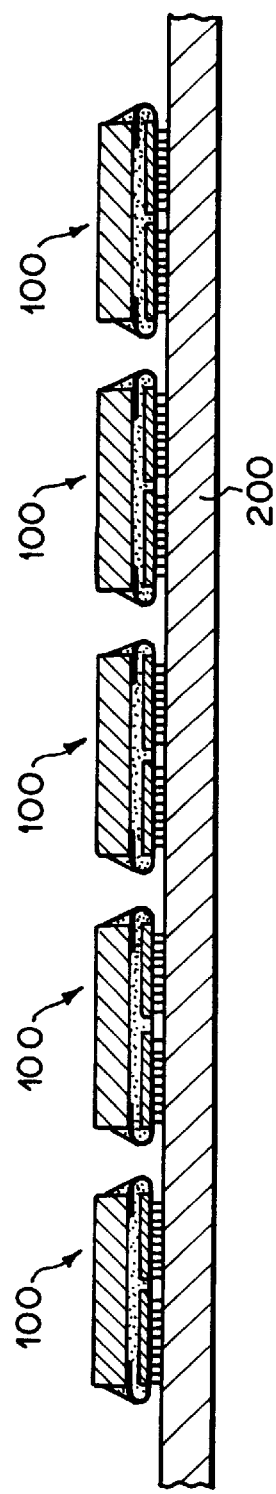

F I G. 5
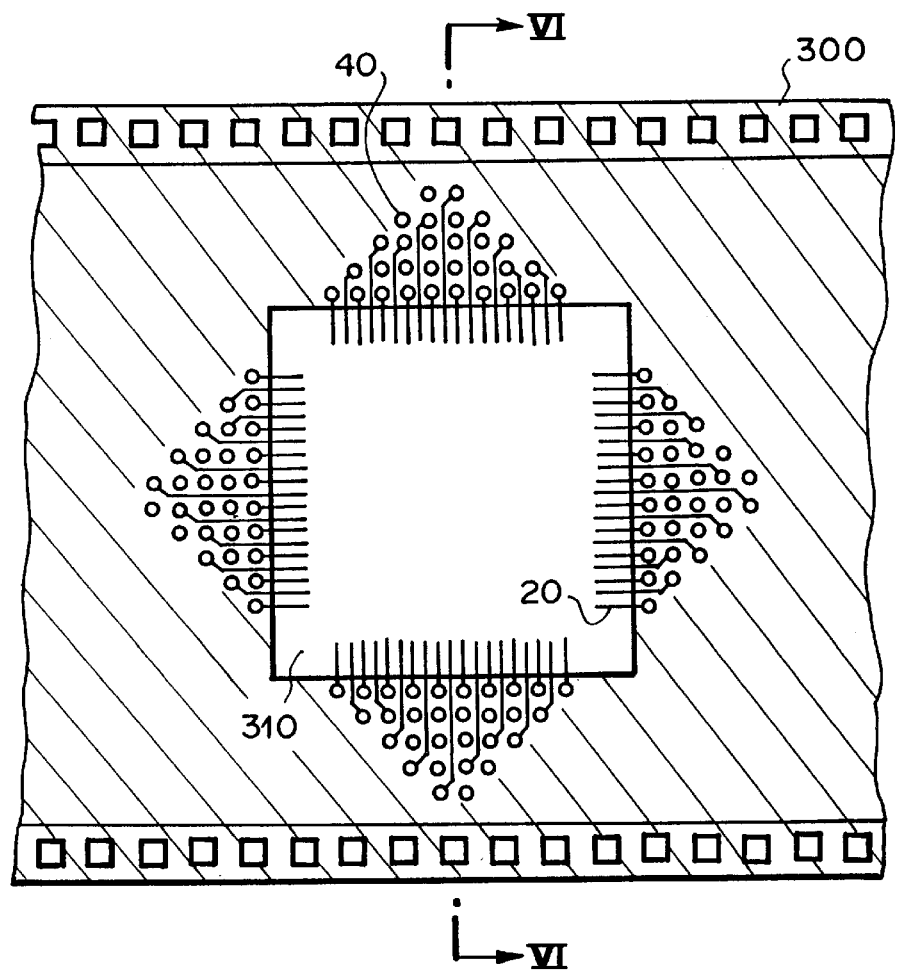
F I G. 6

F I G. 11A
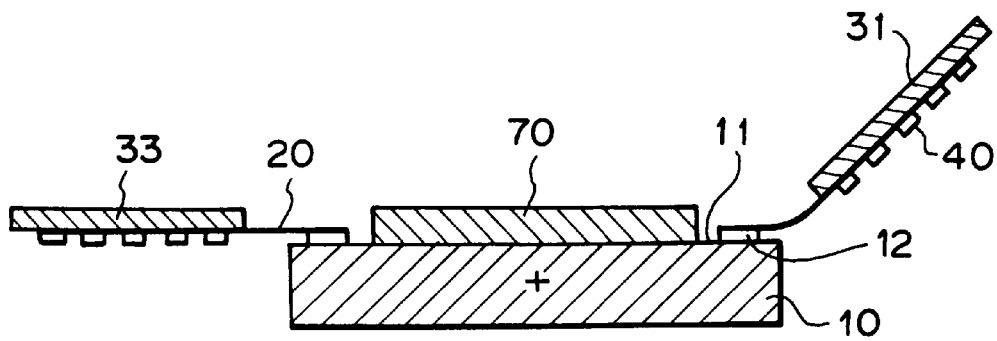
F I G. 11B
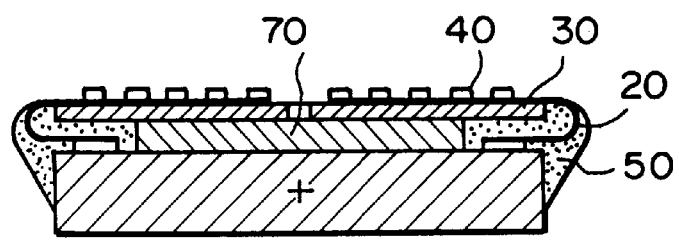
F I G. 12
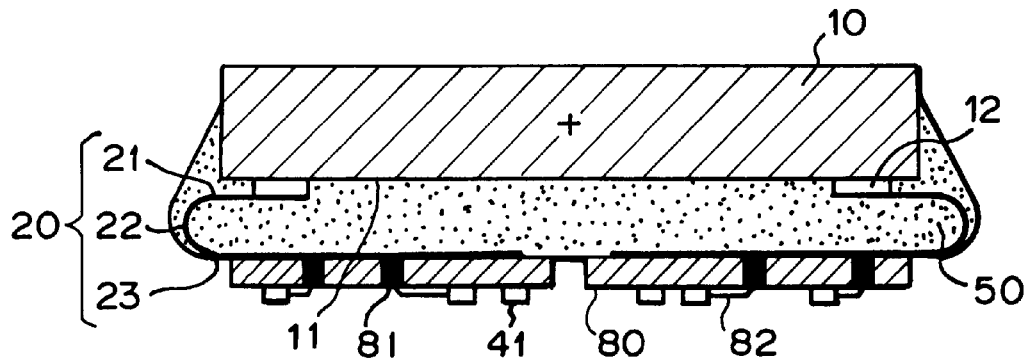

SEMICONDUCTOR DEVICE PACKAGE HAVING A CONNECTION SUBSTRATE WITH TURNED BACK LEADS AND METHOD THEREOF

BACKGROUND OF THE INVENTION

1. Field of the Invention

The present invention relates to a semiconductor device package having a mount structure and a semiconductor device mount method, and particularly to a semiconductor mount structure which can mount a semiconductor device thereon while having substantially the same size as the semiconductor device.

2. Description of the Related Art

This type of semiconductor device has been disclosed in Japanese Laid-open Patent Application No. Hei-7-509352.

In the semiconductor device mount structure disclosed in the above publication, a gap is provided in a sheet-shaped support structure to divide the support structure into a center portion and an external fix element through the gap. The center portion is provided with plural center terminals, and the external fix element is provided with plural external terminals. Further, a lead is provided to connect each of the plural center terminals and each of the plural external terminals to each other through the gap. The support structure is overlaid on the semiconductor device to connect plural electrodes disposed on the peripheral portion of the semiconductor device to the leads located on the gap of the support structure, thereby implementing the semiconductor device mount structure in which the electrodes, that is, the center terminals are provided so as to be located inwardly from the outer shape of the semiconductor device.

In general, a semiconductor device must be tested while mounted in a package, because it is difficult to perform detailed tests on the characteristics of the semiconductor device and the circuit operation thereof when it is tested as a single body. Accordingly, a jig such as a test socket or the like is easily detachably mounted.

However, according to the prior art described above, the center terminals are provided on the circuit surface or plane of the semiconductor device to electrically connect the semiconductor device to the external. Therefore, when a testing electrode is pressed against to the center terminals in a semiconductor device testing process after the semiconductor device is mounted, the press force of the testing electrode is directly applied to the circuit plane of the semiconductor device. For example, in the case where the number of the center terminals is equal to 100 and the press force which is necessary for the testing electrode to be conducted to the semiconductor device is equal to 50 g per terminal, the total press force is equal to 5000 g. Therefore, there is a risk that the semiconductor device is broken when the press force is applied to the circuit plane of the semiconductor device. As described above, the terminals are provided on the circuit plane of the semiconductor device in the above prior art, and thus the prior art has a problem that the terminals on the circuit plane of the semiconductor device has an adverse effect on the reliability of the package.

There is another test method which is different from the above test method. In this method, a package is mounted on a test substrate by soldering for test, and then the package is detached from the test substrate after the test is completed. However, this method needs not only long time and high cost, but also needs to increase the temperature of the package up to the melting point of the solder when the package is mounted on and detached from the test substrate. Therefore, the thermal history of the package itself is increased, and this has an adverse effect on the reliability of the package.

SUMMARY OF THE INVENTION

An object of the present invention is to provide a semiconductor device mount structure in which the outer dimension of a package is substantially equal to the outer dimension of an LSI chip, and high-density mount is performed.

Another object of the present invention is to provide a semiconductor device mount structure in which no press force is needed to be applied to the circuit surface or circuit plane of a semiconductor device in a test process.

Further object of the present invention is to provide a semiconductor device mount structure in which no heat is needed to be applied to a semiconductor device when the structure is mounted on a test substrate by soldering in a test process.

Still further object of the present invention is to provide a semiconductor device mount structure in which the outer dimension of the mount surface or mount plane is substantially equal to the outer dimension of the principal surface or principal plane of a semiconductor device by using a conventional standard TAB mount process.

In order to attain the above objects, according to a first aspect of the present invention, a mount structure of a semiconductor device according to a first aspect of the present invention includes a semiconductor device, a connection substrate disposed at the lower portion of the semiconductor device, and leads which are connected to external connection terminals of the semiconductor device at one ends thereof, turned back (folded) and are connected to prescribed wires of the connection substrate at the other ends thereof.

In the above-described semiconductor device mount structure, the connection substrate contains a mount plane on which plural mount electrodes are provided, the prescribed wires and the plural mount electrodes are connected to each other.

In the above-described semiconductor device mount structure, the connection substrate contains a mount plane on which plural mount electrodes are provided, and the prescribed wires are provided on a principal plane which is different from the mount plane of the connection substrate.

In the above-described semiconductor device mount structure, the connection substrate comprises a plurality of flexible substrates.

In the above-described semiconductor device mount structure, the outer shape of the connection substrate which is constructed by the plural flexible substrates is set to be identical or similar to that of the semiconductor device.

In the above-described semiconductor device mount structure, the shape of each of the plural flexible substrates is a right-angled isosceles triangle.

The above-described semiconductor device mount structure further contains sealing resin for sealing the gap between the semiconductor device and the substrate and also sealing the leads.

The above-described semiconductor device mount structure contains an insulating member which is provided between the semiconductor device and the connection substrate and brought into contact with each of the semiconductor device and the substrate.

Further, in the above-described semiconductor device mount structure, the plural mount electrodes are arranged in a grid pattern.

A semiconductor device mount structure according to a second aspect of the present invention contains a semiconductor device having external connection terminals which are provided at the lower face thereof, a connection substrate which is provided with mount electrodes on a mount surface thereof and overlaid on the semiconductor device so that the face opposite to the mount plane is confronted to the lower surface of the semiconductor device, and leads which are turned back so as to connect the external connection terminals and the mount electrodes to each other.

Further, a semiconductor device mount structure according to a third aspect of the present invention comprises a semiconductor device having external connection terminals which are provided at the lower face thereof, a connection substrate which is provided with mount electrodes on a mount surface thereof and with wires on the opposite face to the mount plane and is overlaid on the semiconductor device so that the face opposite to the mount plane is confronted to the lower surface of the semiconductor device, and leads which are turned back so as to connect the external connection terminals and the wires to each other.

In the semiconductor device mount structure according to the third aspect of the present invention, the connection substrate contains through holes which penetrate through the connection substrate to connect the mount electrodes and the wires.

A semiconductor device mount method according to a fourth aspect of the present invention in which a semiconductor device provided with external connection electrodes on the lower surface thereof is mounted by using a tape carrier having mount electrodes, leads connected to the mount electrodes and a device hole into which one ends of the leads are projected, is characterized by comprising the steps of: connecting the external connection electrodes of the semiconductor device to the one ends of the leads projecting into the device hole of the tape carrier to mount the semiconductor device on the tape carrier, cutting out (rapping) the tape carrier having the semiconductor device mounted thereon along the outer shape of the array of the mount electrodes, turning back (folding) each of the cut-out tape carriers with the point on the lead at the center of the turn-back, and fixing the semiconductor device to the turn-back tape carrier.

Further, the above semiconductor device mount method further comprises the step of arranging electrodes in a right-angled isosceles triangular shape which contains as an oblique line one side of the device hole on the tape carrier on which the semiconductor device is mounted.

Still further, a semiconductor device mount method according to a fifth aspect of the present invention in which a semiconductor device provided with external connection electrodes on the lower surface thereof is mounted by using a tape carrier having mount electrodes, leads connected to the mount electrodes and a device hole into which one ends of the leads are projected, is characterized by comprising the steps of: connecting the external connection electrodes of the semiconductor device to the one ends of the leads projecting into the device hole of the tape carrier to mount the semiconductor device on the tape carrier, cutting out (rapping) the tape carrier having the semiconductor device mounted thereon along the outer shape of the array of the mount electrodes, turning back (folding) each of the cut-out tape carriers with the point on the lead at the center of the turn-back so that an insulating member is sandwiched between the cut-out tape carrier and the semiconductor device, and fixing the semiconductor device to the turn-back tape carrier.

BRIEF DESCRIPTION OF THE DRAWINGS

FIG. 3 is a cross-sectional view showing the first embodiment of the present invention;

FIG. 4 is a cross-sectional view showing the first embodiment of the present invention;

FIG. 5 is a top view showing a manufacturing method of the first embodiment of the present invention;

FIG. 6 is a cross-sectional view which is taken along a line VI—VI in FIG. 5;

FIGS. 11A and 11B are cross-sectional views showing a manufacturing method according to a second embodiment of the present invention; and FIG. 12 is a cross-sectional view showing a third embodiment of the present invention.

DETAILED DESCRIPTION OF THE PREFERRED EMBODIMENTS

Preferred embodiments according to the present invention will be described hereunder with reference to the accompanying drawings.

Figure 1:
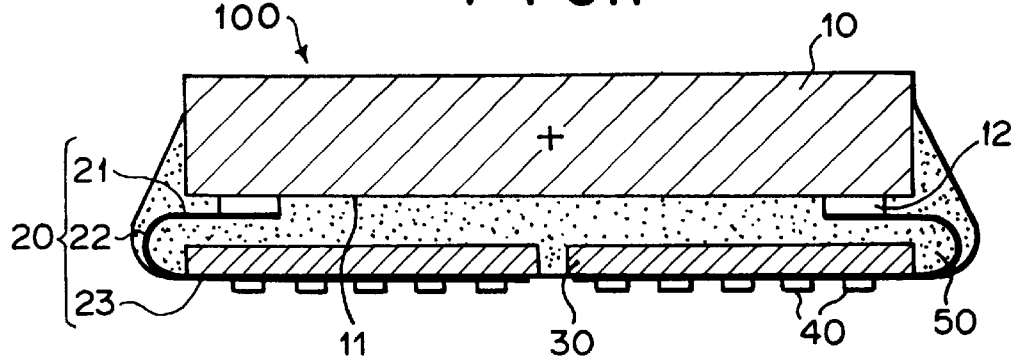
FIG. 1 is a cross-sectional view showing a first embodiment of the present invention.

FIG. 1 is a cross-sectional view showing a semiconductor mount structure according to a first embodiment of the present invention.

Referring to FIG. 1, a semiconductor device mount structure according to a first embodiment of the present invention includes a semiconductor device 10, a connection substrate 30 which is disposed at the lower side of the semiconductor device 10, and leads 20 which are designed so as to be turned back (for example, in a U-shape) and so that one end of each lead is connected to an external connection electrode 12 of the semiconductor device 10 and the other end thereof is connected to a mount electrode 40 on the connection substrate 30.

The connection substrate 30 is disposed such that the principal surface or principal plane 11 of the connection substrate 30 on which the mount electrodes 40 are provided is not faced to the circuit surface or circuit plane of the semiconductor device 10. Further, wires which are connected to the mount electrodes 40 are provided on the principal plane of the connection substrate 30 on which the mount electrodes 40 are provided.

The external connection electrodes 12 are electrodes for TAB bonding which are provided on the peripheral portion of the circuit plane 11 of the semiconductor device 10.

As described above, each lead is turned back so that the external connection electrode 12 provided on the circuit plane 11 of the semiconductor device 10 and the mount electrode 40 of the connection substrate 30 are connected to each other, and comprises an inner lead portion 21, a turn-back portion 22 and an outer lead portion 23. The lead 20 is preferably formed by plating copper base with gold. Copper can reduce the wiring resistance because it has a low resistance value, and suppress drop of voltage through wires. The gold plating can prevent oxidation of copper serving as base material, and at the same time it makes it easy to connect the lead 20 and the external connection electrode 12 of the semiconductor device 10.

The inner lead portion 21 is connected to the external connection electrode 12 disposed on the circuit plane 11 of the semiconductor device 10.

The outer lead portion 23 is connected to each of the plural mount electrode 40 which are provided on the connection substrate 30.

The turn-back portion 22 is provided between the inner lead portion 21 and the outer lead portion 23, and corresponds to a portion which is formed by bending the lead 20 by 180°.

Figure 2:
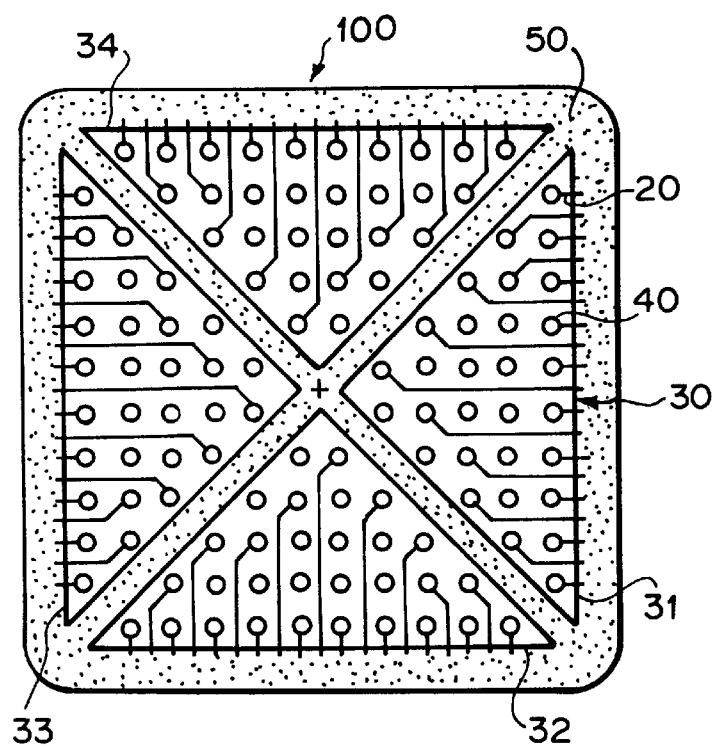
FIG. 2 is a bottom view showing the first embodiment of the present invention.

Referring to FIGS. 1 and 2, the connection substrate 30 comprises plural carrier substrates into which one carrier film rapped (cut out). In this embodiment, the connection substrate 30 comprises four carrier substrates 31, 32, 33 and 34, and it is designed in the same shape as or in a similar shape to the outside shape of the semiconductor device 10. Each of the carrier substrates 31, 32, 33 and 34 is preferably designed in a right-angled isosceles triangular shape. In this case, the four carrier substrates 31, 32, 33 and 34 are preferably disposed so as to form as a whole a square as shown in FIG. 2. Further, it is preferable that the material of the carrier substrates 31, 32, 33 and 34 is polyimide.

The mount electrodes 40 are provided in a grid pattern on the connection substrate 30. In this embodiment, the number of the mount electrodes 40 is set to 120. When the mount electrodes 40 are arranged at a pitch of 1.27 mm, the outer dimension of a small LSI package 100 is equal to about 17 mm×17 mm, and the outer dimension of the semiconductor device 10 is equal to about 15 mm×15 mm. Further, the number of the external connection electrodes 12 provided on the periphery of the semiconductor device 10 is set to 30, and the pitch of the external connection electrodes is set to about 0.5 mm. In order to make it easy to understand the structure of the present invention, in the following drawings the external connection electrodes 12 and the leads 20 are illustrated so that the number thereof is smaller than the actual number.

Further, sealing resin 50 is filled between the semiconductor device 10 and the connection substrate 30. The sealing resin also covers the leads 20.

Referring to FIG. 3, a semiconductor package 100 having the semiconductor device mount structure of this embodiment is mounted on a wiring substrate 200. The mount electrodes 40 of the semiconductor package 100 are connected to connection pads 201 on the wiring substrate 200 by solder 60.

Referring to FIG. 4, plural semiconductor packages 100 are mounted at high density on the wiring substrate 200.

Next, a method of manufacturing the semiconductor device mount structure, i.e. semiconductor device mount method, according to the present invention will be described in detail with reference to the accompanying drawings.

Referring to FIGS. 5 and 6, a device hole 310 and mount electrodes 40 are provided in a tape carrier 300. The tape carrier 300 is formed by providing metal wires on an organic insulating material tape. The organic insulating material tape is preferably formed of polyimide because polyimide has high resistance to solvents and high resistance to heat, so that it hardly suffers damage in a heating process, a cleaning process, etc. to manufacture electrical part packages and thus it is very suitable as the material for the electrical part packages. The metal wire is preferably formed by plating copper serving as base material with metal.

A copper foil layer is fixed onto the surface of the organic insulating material tape of the tape carrier 300 by adhesive agent, and a pattern of leads 20 having inner lead portions 21 which are projected into the device hole 310 for securing the semiconductor device 10 and the mount electrodes 40 serving as the connection terminals with the wire substrate 200 are formed on one surface of the organic insulating material tape.

The mount electrodes 40 are arranged in areas of a right-angled isosceles trianglular shape whose bottom side corresponds to each side of the device hole 310. This is because the number of external electrodes is large when fabrication of an LSI package is completed as described hereunder and thus they can be arranged efficiently.

Further, the conductor wire on the tape carrier 300 between the mount electrode 40 and the lead 20 is beforehand coated with insulating material such as solder resist or the like. This is to prevent short-circuit between the leads 20 which are exposed when the fabricated LSI package is mounted on the wiring substrate 200 by soldering.

Figure 7:
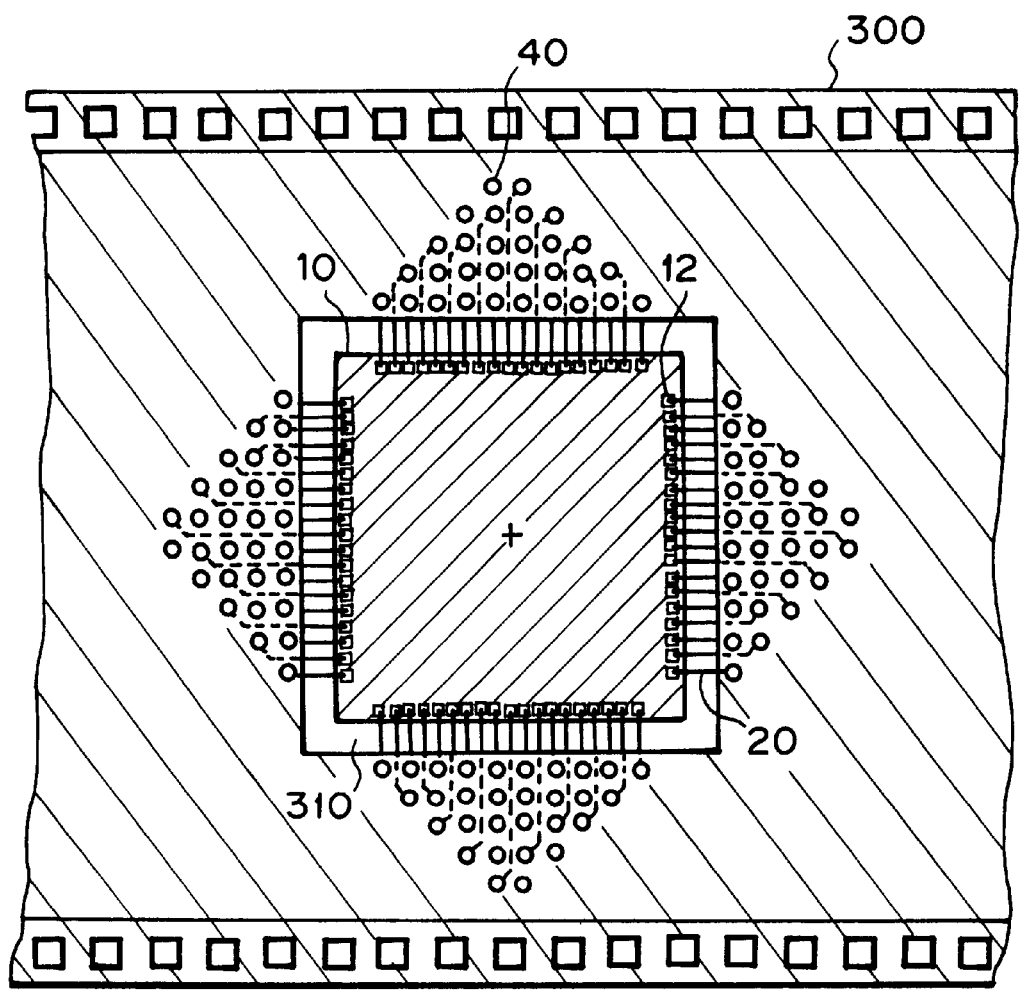
FIG. 7 is a top view showing the manufacturing method of the first embodiment of the present invention.

Referring to FIG. 7, the semiconductor device 10 is mounted in the device hole of the tape carrier 300. First, the principal plane of the tape carrier 300 on which mount electrodes 40 are provided is confronted to the circuit plane 11 of the semiconductor device 10. Subsequently, the external connection electrodes 12 provided on the circuit plane 11 of the semiconductor device 10 and the inner lead portions 21 projecting into the device hole 310 of the tape carrier 300 are positioned so that they are overlapped with each other, and the inner lead portions 21 and the external connection electrodes 12 are bonded to each other.

The surface of the external connection electrodes 12 is subjected to gold plating, and the gold plating thus formed is connected to gold plating of the inner lead portions 21 by gold-gold thermocompression bonding. The completion of this process results in electrical connection between the external connection electrodes 12 of the semiconductor device 10 and the mount electrodes 40 on the tape carrier 300.

In this state, the electrical test of the semiconductor device 10 can be easily performed. In general, the pitch of the external connection electrodes of the semiconductor device is very fine, and each of the external connection electrodes is very small. In addition, the external connection electrodes are just near to the circuit plane of the semiconductor device. Therefore, it is very difficult to make a socket for test, and the cost thereof is very high. In a case where a minute test probe or the like is brought into contact with the external connection electrodes of the semiconductor device, there is a risk that the test probe erroneously abuts against the circuit plane to damage the semiconductor device. However, in the structure of the present invention, the conduction with the semiconductor device can be very simply performed by using a press type connector or the like by which the mount electrodes 40 of the tape carrier 300 are sandwiched from the front and back sides, and no damage is given to the semiconductor device 10 because it is unnecessary to bring the connector to the semiconductor device 10. An article which is judged as being good by the electrical test is advanced to a next fabrication process.

Figure 8:
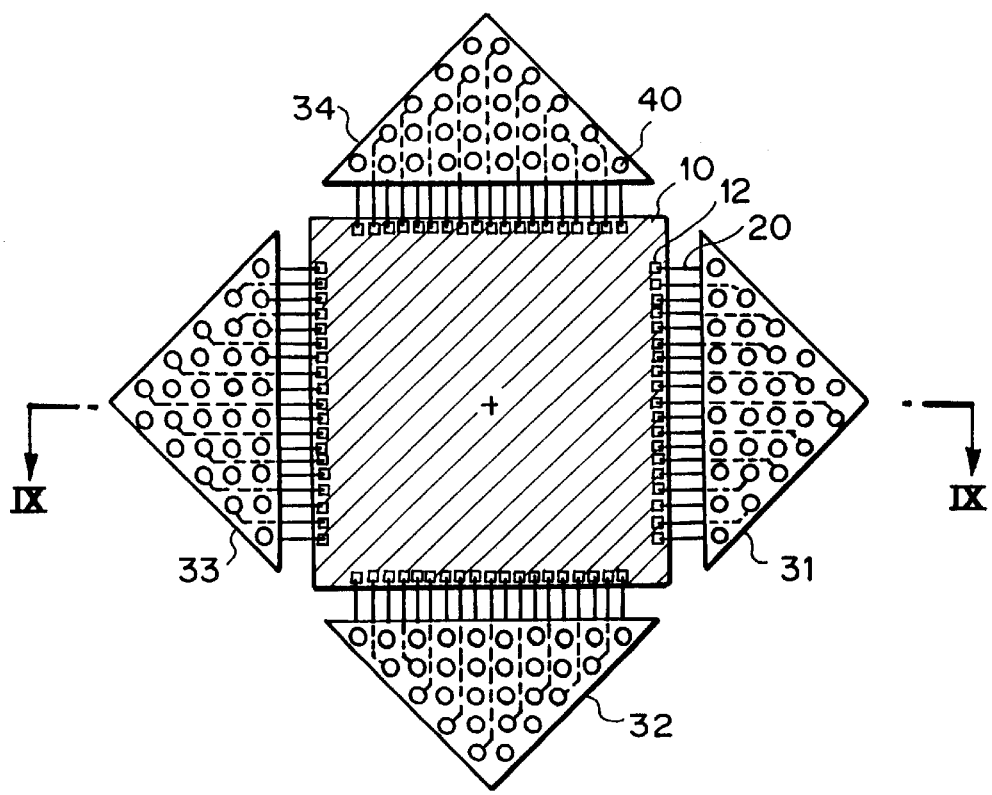
FIG. 8 is a top view showing the manufacturing method of the first embodiment of the present invention.
Figure 9:
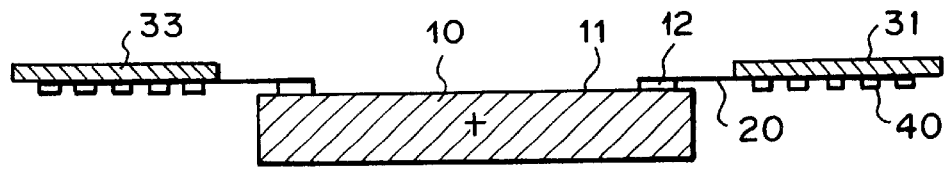
FIG. 9 is a cross-sectional view which is taken along a line IX—IX in FIG. 8.

Referring to FIGS. 8 and 9, the tape carrier 300 is rapped. The rapping is performed by cutting the tape carrier 300 by right-angled isosceles triangles so that the mount electrodes 40 of the tape carrier 300 connected to each side of the semiconductor device 10 are surrounded by each right-angled isoscele triangle, whereby the tape carrier 100 is divided into four rapped carrier substrates 31, 32, 33 and 34 having the same outer shape.

Figure 10:
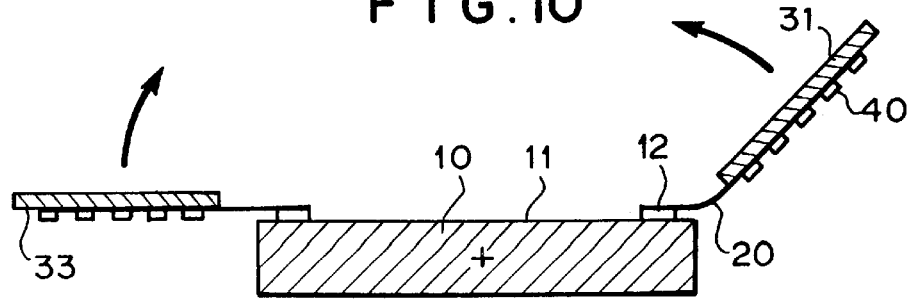
FIG. 10 is a cross-sectional view showing the manufacturing method of the first embodiment of the present invention.

Referring to FIG. 10, the divided four carrier substrates 31, 32, 33 and 34 at the respective sides of the semiconductor device are turned back (folded) onto the circuit plane 11 with the lead portions projecting outwardly from the external connection electrodes 12 of the semiconductor device 10 at the center of the turn by 180°. Since each of the rapped carrier substrates 31, 32, 33 and 34 is right-angled isosceles triangular, a square-shaped connection substrate 30 is formed on the circuit plane 11 of the semiconductor device 10. The connection substrate 30 is so as to cover substantially the whole surface of the circuit plane 11 of the semiconductor device 10, and thus a large number of the mount electrodes 40 can be disposed in an efficient arrangement.

Referring to FIG. 1, sealing resin 50 is filled into the gap between the connection substrate 30 and the semiconductor device 10 so as to cover the turn-back leads 20. If heat is needed, the sealing resin 50 is hardened by heat. The sealing resin 50 may be formed of insulating mold resin material which is used for normal plastic packages. When the gap between the connection substrate 30 and the circuit plane 11 of the semiconductor device 10 is small, the sealing resin may hardly flow into the inside. In this case, insulating epoxy resin or the like which is lower in viscosity is preferably used.

Referring to FIG. 3, the semiconductor package 100 having the semiconductor device mount structure according to the present invention is mounted on the wiring substrate 200. The following is one of mount methods. First, soldering balls are supplied onto the mount electrodes 40 of the semiconductor package 100 as in the case of BGA (ball grid array) which are normally used, and cream solder is supplied onto the connection pads 201 on the wiring substrate 200 by a screen printing method. Subsequently, the semiconductor package 100 is positioned to and mounted on the connection pads on the wiring substrate 200, and the heat reflow is performed to complete the mount process. When eutectic crystal solder of Sn63/Pb37 Wt % is used as the solder, the temperature of the heat reflow is preferably set to about 210° C.

As described above, according to the present invention, the test of the semiconductor device 10 is performed when the semiconductor device 10 is mounted on the tape carrier 300, and the tape carrier 300 is rapped after the test to form the carrier substrates 31, 32, 33 and 34, and the carrier substrates 31, 32, 33 and 34 are turned back so as to confront the circuit plane 11 of the semiconductor device 10. Therefore, a test jig is not brought into contact with the semiconductor device 10 when the semiconductor device 10 is tested because no mount electrode (terminal) 40 exists on the semiconductor device 10, and thus the semiconductor device 10 suffers no damage. Further, when the semiconductor package 100 is mounted on the wiring substrate 200, there can be obtained the semiconductor device mount structure having an outer dimension which is substantially equal to that of the principal plane of the semiconductor device 10, and having a large number of mount electrodes 40.

Further, each of the carrier substrates 31, 32, 33 and 34 obtained by cutting into a right-angled isosceles triangle whose bottom side corresponds to each side of the device hole 310 is turned back to the circuit surface 11, whereby a substantially square-shaped mount plane can be obtained by the carrier substrates 31, 32, 33 and 34. Therefore, the number of mount electrodes 40 which are used for connection with the wiring substrate 200 can be increased.

Next, a second embodiment according to the present invention will be described in detail with reference to the accompanying drawings. The second embodiment is characterized in that an insulating sheet 70 is provided between the connection substrate 30 and the circuit plane 11 of the semiconductor device 10. The other construction is identical to the first embodiment.

Referring to FIGS. 11A and 11B, the insulating sheet 70 is provided between the circuit plane 11 of the semiconductor device 10 and the connection substrate 30, and abuts against each of the circuit plane 11 and the connection substrate 30. The insulating sheet 70 is designed to have such a thickness that the mount plane constructed by the carrier substrates 31, 32, 33 and 34 are flat when each of the carrier substrates 31, 32, 33 and 34 constituting the connection substrate 30 is turned back toward the circuit plane 11 of the semiconductor device 10.

The insulating sheet 70 is preferably formed of silicone rubber sheet because the silicone rubber sheet has elasticity and thus when each of the carrier substrates 31, 32, 33 and 34 is turned back to abut against circuit plane 11 of the semiconductor device 10, the force applied to the circuit plane 11 of the semiconductor device 10 can be dispersed by the silicone rubber sheet, thereby reducing the damage to be imposed onto the circuit plane 11.

Next, the manufacturing method according to the embodiment will be described.

Referring to FIG. 11A, the insulating sheet 70 is provided at such a size as to be located inside the array of the external connection electrodes 12 on the circuit plane 11 of the semiconductor device 10.

Referring to FIG. 11B, the carrier substrates 31, 32, 33 and 34 are turned back to abut against the insulating sheet 70. In this state, the sealing resin 50 is filled.

As described above, according to this embodiment, since the insulating sheet 70 is provided between the circuit plane 11 of the semiconductor device 10 and the connection substrate 30, the flatness of the connection plate 30 can be enhanced.

In the above-described embodiment, an adhesive member may be provided on each of both the sides of the insulating sheet 70. In this case, the semiconductor device can be more easily mounted.

Next, a third embodiment of the present invention will be described in detail. The third embodiment is characterized in that a connection substrate is provided at the lower side of the leads. The other construction is identical to the first embodiment.

Referring to FIG. 12, a connection substrate 80 is provided at the lower side of the leads 20. That is, the outer lead portion 23 of each lead 20 is connected to the principal plane which is different from the mount plane of the connection substrate 80. The connection substrate 80 is provided with electrodes to be connected to the outer lead portions 23, through holes 81 which are connected to the above electrodes and penetrate through the connection substrate 80, wires 82 which are connected to the through holes 81 and provided on the mount plane of the connection substrate 80, and plural mount electrodes 41 which are connected to the wires 82. Each of the plural mount electrodes 41 is electrically connected to the lead 20 through the through hole 81 which penetrates through the connection substrate 80.

Next, the manufacturing method according to this embodiment will be described.

Wires are formed at desired positions on both the principal planes of the tape carrier, and through holes 81 through which the wires on both the principal planes are connected to each other are provided. The leads 20 are provided on one principal plane of the tape carrier, and the mount electrodes 41 are provided on the other principal plane. The principal plane of the tape carrier on which the mount electrodes 41 are provided and the circuit plane 11 of the semiconductor device 10 are confronted and positioned to each other to subject the inner lead portions 21 and the external connection electrodes 12 to bonding connection. The steps subsequent to this step are identical to those of the first embodiment.

As described above, according to this embodiment, the connection substrate 80 is provided at the lower side of the leads 20. That is, whole portions of the leads 20 are positioned between the connection substrate 80 and the semiconductor device 10. Therefore, when the semiconductor package is mounted on the wiring substrate 200, noises which occur due to the leads 20 and the wires on the wiring substrate 200 can be reduced more greatly. This is because the connection substrate 80 functions as an insulating member between the leads 20 and the wires on the wiring substrate 200.

In this embodiment, the insulating sheet of the second embodiment may be provided between the circuit plane 11 of the semiconductor device 10 and the leads 20. The thickness of the insulating sheet is set so that the connection substrate 80 is flat.

As is apparent from the foregoing description, according to the present invention, the tape carrier on which the semiconductor device is mounted is cut on the outer periphery of the array of the mount terminals on the tape carrier to form carrier substrates, and the carrier substrates thus formed are turned back to the circuit plane side with the leads at the center of the turn and then fixed by sealing resin. Therefore, the semiconductor device mount structure having the mount plane which has substantially the same size as the outer dimension of the principal plane of the semiconductor device 10 can be obtained by using a TAB tape bonding technique which has been conventionally generally adopted.

Further, according to the present invention, when the semiconductor device is mounted to the tape carrier, the external connection electrodes of the semiconductor device is electrically connected to the mount electrodes which are not located on the semiconductor device, and thus the electrical test of the semiconductor device can be easily performed while the electrodes of the tester are not brought into contact with the circuit plane of the semiconductor device. Therefore, the test of the semiconductor device can be more facilitated.

Still further, according to the present invention, the outer dimension of the semiconductor device mount structure is slightly larger than that of the semiconductor device by the amount corresponding to the portion of the turned leads and the seal resin. Therefore, the outer dimension of the semiconductor mount structure can be reduced to be further smaller than PGA (pin grid array) and QFP (quad flat package). As a result, a larger number of semiconductor devices can be mounted on the mount structure in spite of the smaller occupation area, and thus the semiconductor devices can be mounted at high density.

What is claimed is:

1. A semiconductor device package comprising:
   a semiconductor device having external connection terminals provided on one side thereof;
   a plurality of connection substrates spaced from and disposed facing said one side of said semiconductor device, wherein said connection substrates combined together have a substantially similar size as said semiconductor device, said connection substrates each having mount electrodes formed on one side thereof, which is opposite a second side facing said one side of said semiconductor device;
   leads having one end connected to said external connection terminals of said semiconductor device and having another end connected to said mount electrodes, with the leads wrapping around an outer periphery of the connection substrates; and
   a spacer comprising a sealing resin that spaces said connection substrates from said semiconductor device and also embeds said leads,
   wherein said second side of said connection substrates acts as a surface for mounting said semiconductor device via said sealing resin.

2. The semiconductor device package as claimed in claim 1, wherein said connection substrates comprise flexible substrates.

3. The semiconductor device package as claimed in claim 1, wherein each of said flexible substrates is a right-angled isosceles triangle having a same size, so that the flexible substrates generally form a square.

4. The semiconductor device package as claimed in claim 1, further comprising an insulating film sandwiched between said semiconductor device and said connection substrates and abutting against said one side of said semiconductor device and said side of said connection substrates opposite said one side of said semiconductor device.

5. The semiconductor device package as claimed in claim 1, wherein said mount electrodes are arranged in a grid pattern.

6. The semiconductor device package as claimed in claim 4, wherein said mount electrodes are arranged in a grid pattern.

7. A semiconductor device package comprising:
   a semiconductor device having external connection terminals provided on one side thereof;
   a plurality of connection substrates spaced from and disposed facing said one side of said semiconductor device, wherein said connection substrates combined together have a substantially similar size as said semiconductor device and each of said connection substrates has mount electrodes on a mount surface formed on one side thereof, which is opposite a second side thereof facing said semiconductor device;
   wire connected to said mount electrodes;
   leads having one end connected to said external connection terminals of said semiconductor device and having another end connected to said mount electrodes via said wires; and
   a sealing resin that is interposed between said external connection terminals of said semiconductor device and said connection substrates and also embeds said leads,
   wherein said leads are U-shaped and extended outwardly beyond an outer periphery of said connection substrates, and said second side of said connection substrates acts as a surface for mounting said semiconductor device via said sealing resin.

8. The semiconductor device package as claimed in claim 7, wherein said leads rest on the side of said connection substrates opposite to said mount surface, each of said connection substrates containing through holes, said through holes being occupied by electrodes that connect said leads to said wires connected to said mount electrodes.

9. A semiconductor device package comprising:

a semiconductor device having external connection terminals provided on one side thereof;

a plurality of connection substrates spaced from and disposed facing the one side of the semiconductor device, wherein the connection substrates combined together have a substantially similar size as the semiconductor device and each of the connection substrates has mount electrodes on a mount surface formed on one side thereof, which is opposite a second side facing the semiconductor device;

an insulating member sandwiched between the semiconductor device and the connection substrates;

leads having on end connected to the external connection terminals of the semiconductor device and having another end connected to the mount electrodes; and a sealing resin that is interposed between the extended connection terminals of the semiconductor device and the connection substrates and also embeds the leads, wherein the leads are substantially U-shaped, wrapping around an outer periphery of the connection substrates, and the second side of the connection substrates acts as a surface for mounting the semiconductor device via the sealing resin.

10. The semiconductor device package as claimed in claim 4, wherein said sealing resin is disposed around said insulating film.

11. The semiconductor device package as claimed in claim 9, wherein said sealing resin is disposed around said insulating member.

* * * * *